US006436603B1

(12) United States Patent
Kuroki et al.

(10) Patent No.: US 6,436,603 B1
(45) Date of Patent: Aug. 20, 2002

(54) IMAGE RECEIVING SHEET FOR THERMAL TRANSFER RECORDING AND LASER THERMAL TRANSFER RECORDING METHOD

(75) Inventors: Takaaki Kuroki; Atsushi Nakajima, both of Tokyo (JP)

(73) Assignee: Konica Corporation, Tokyo (JP)

( * ) Notice: Subject to any disclaimer, the term of this patent is extended or adjusted under 35 U.S.C. 154(b) by 50 days.

(21) Appl. No.: 09/648,145

(22) Filed: Aug. 25, 2000

(30) Foreign Application Priority Data

Aug. 30, 1999 (JP) .......................................... 11-243093

(51) Int. Cl.[7] .............................. G03F 7/34; G03F 7/11

(52) U.S. Cl. ....................... 430/200; 430/207; 430/259; 430/262

(58) Field of Search ................................ 430/200, 201, 430/207, 259, 262

(56) References Cited

U.S. PATENT DOCUMENTS

| | | | | | |
|---|---|---|---|---|---|
| 4,766,053 | A | * | 8/1988 | Shinozaki et al. | 430/256 |
| 5,246,910 | A | * | 9/1993 | Koshizuka et al. | 503/227 |
| 5,270,283 | A | * | 12/1993 | Koshizuku et al. | 503/227 |
| 5,276,003 | A | * | 1/1994 | Koshizuka et al. | 503/227 |
| 5,300,398 | A | * | 4/1994 | Kaszczuk | 430/200 |
| 5,580,693 | A | * | 12/1996 | Nakajima et al. | 430/200 |
| 5,607,809 | A | * | 3/1997 | Nakamura et al. | 430/200 |
| 5,614,935 | A | * | 3/1997 | Ogi et al. | 347/213 |
| 5,633,116 | A | * | 5/1997 | Kapusniak et al. | 430/200 |
| 5,759,738 | A | * | 6/1998 | Tsuno et al. | 430/263 |
| 5,764,268 | A | * | 6/1998 | Bills et al. | 347/213 |
| 5,821,023 | A | * | 10/1998 | Maejima et al. | 430/200 |
| 5,841,462 | A | * | 11/1998 | Matsuo et al. | 347/213 |
| 5,949,466 | A | * | 9/1999 | Kerr et al. | 347/213 |
| 5,986,685 | A | * | 11/1999 | Aoki et al. | 347/213 |
| 6,027,850 | A | * | 2/2000 | Kawakami et al. | 430/200 |
| 6,097,415 | A | * | 8/2000 | Kita et al. | 347/213 |
| 6,133,931 | A | * | 10/2000 | Yoshikawa et al. | 347/213 |
| 6,180,213 | B1 | * | 1/2001 | Kuroki et al. | 428/195 |
| 6,326,121 | B1 | * | 12/2001 | Takahashi | 430/200 |

FOREIGN PATENT DOCUMENTS

| | | |
|---|---|---|
| JP | 6-79980 | 3/1994 |
| JP | 6-122280 | 5/1994 |
| JP | 6-126993 | 5/1994 |
| JP | 6-199043 | 7/1994 |
| JP | 7-19052 | 3/1995 |
| JP | 9-52458 | 2/1997 |

* cited by examiner

*Primary Examiner*—Richard L. Schilling
(74) *Attorney, Agent, or Firm*—Frishauf, Holtz, Goodman & Chick, P.C.

(57) ABSTRACT

An image receiving sheet for thermal transfer recording is disclosed. The image receiving sheet comprises a lower layer and an image receiving layer on the support, and variation of position of point of a needle satisfies the following conditions when the needle having a diameter of 1 mm is touched on the image receiving sheet with a load of 10 g and the temperature is risen at a rate of 5° C. per minute;

{(Position at 25° C.–Position at 30° C.)/Position at 25° C.}× 100%≦5%

{(Position at 25° C.–Position at 130° C.)/Position at 25° C.}× 100%≧50%.

16 Claims, 3 Drawing Sheets

IMAGE RECEIVING SHEET FOR THERMAL TRANSFER RECORDING AND LASER THERMAL TRANSFER RECORDING METHOD

FIELD OF THE INVENTION

The present invention relates to an image receiving sheet for a thermal transfer recording on which an image can be transferred by heat generated by converting light to heat, particularly, relates to an intermediate transfer medium type image receiving sheet for the thermal transfer image recording.

BACKGROUND OF THE INVENTION

A method by applying pressure or heating by a thermal head has been put to practical use for forming an image by thermal transfer. Such the method has advantages such as a lowered noise, a simple structure, a free of maintenance and a dry processing. Moreover, a resolving ability of from 400 to 600 dpi can be recently obtained as a result of rising of the density of the thermal head. However, the resolving ability of the usual thermal transfer method is limited to the above since the density of the thermal head is difficultly made higher than the present condition.

From the viewpoint of the above-mentioned, a heat mode laser thermal transfer method has been proposed, in which a light-heat conversion type recording element is imagewise exposed by laser light. The resolution ability can be considerably risen by this method since the diameter of laser beam can be condensed to several micrometers.

A high precision image can be written on an image receiving element used in the light-heat conversion type heat mode recording method. However, the image receiving element has a problem that a sufficient transferred image cannot be obtained when the roughness or undulation of the surface of the image receiving element is large. Accordingly, a process has been proposed for forming an image on a receiving element having a rough surface, in which the image is once transferred on an intermediate transfer element having a smooth surface and the image is retransferred on a desired image receiving element having a rough surface by a method such as laminate.

The image quality can be considerably risen by such the improvement, and the reproduction of a halftone dot can be realized. As a result of that, such the method has been made applicable in the field in which an image similar to a printed image or a photographic image is required.

An example of such the application includes that for a color proof or a color filter.

On the other hand, the light-heat conversion type heat mode recording method includes a method in which a fusible ink or a sublimatable dye is transferred to form an image.

Japanese Patent Publication to Open Public Inspection (JP O.P.I.) No. 6-126993 describes a method by which an image of a sublimatable dye is formed by laser light on an intermediate transferring medium and the image is retransferred to a final receiving element by applying pressure and heat. The image by such the method can be used as a proof of a printing image. In such the application, however, there is a problem that the final color of the image formed by the sublimable dye and that of the image formed by the printing ink are different since color hue reproduction between the dye and the pigment, and together with a problem of spreading of character caused by the different of the gradation at the edge portion of the images formed by the sublimable dye and that of formed by the printing ink.

In contrast to that, the pigment the same as that used in the printing matter can be used in the recording material using the fusible ink image. Therefore such the recording material is considerably suitable for making a proof. Examples of such the suitably usable material include those described in JP O.P.I. Nos. 6-79980, 6-122280, 6-199043 and 9-52458.

Although the image receiving sheet for the laser fusible thermal transfer recording disclosed in such the publications have the merits as above-mentioned. Paper having the surface with a high smoothness such as art paper and coated paper is principally used in such the methods, and the transfer ability of the image to mat paper and high quality paper is not insufficient.

For rising the suitability to such the paper, Japanese Examined Patent Publication No. 7-19052 describes a technique in which a resin layer having a softening point of lower 10° C. or more than that of the receiving layer is provided under the receiving layer. Such the embodiment seems advantageous from the viewpoint of the suitability to paper only. It has been confirmed, however, that some problems such as that formation of image defect, lowering in the sensitivity, lacking of the uniformity of image density in the widthwise direction, and formation of ablation, are caused when the above-mentioned embodiments are applied in the high resolution laser thermal transfer recording.

SUMMARY OF THE INVENTION

The object of the invention is to provide a receiving sheet for laser thermal transfer recording having a high sensitivity and by which a large size output similar to the printed matter can be constantly obtained with a high fidelity and without any image defect and density fluctuation in the widthwise direction, and the quality of a finally printed matter can be reproduced with high fidelity by transferring the image on paper the same as that to be used for the practical printing. Further object of the invention is to provide a thermal transfer recording method using the image receiving sheet as the intermediate transfer medium.

The invention and its embodiment are described.

An image receiving sheet for thermal transfer recording comprising a support having thereon a lower layer and an image receiving layer are provided in this order from the support, wherein variation of position of point of a needle satisfies the following conditions when the needle having a diameter of 1 mm is touched on the image receiving sheet with a load of 10 g and the temperature is risen at a rate of 5° C. per minute;

$$\{(\text{Position at }25°\text{ C.}-\text{Position at }30°\text{ C.})/\text{Position at }25°\text{ C.}\}\times 100\%\leqq 5\%$$

$$\{(\text{Position at }25°\text{ C.}-\text{Position at }130°\text{ C.})/\text{Position at }25°\text{ C.}\}\times 100\%\geqq 50\%.$$

The image receiving sheet wherein variation of position of a point of a needle satisfies the following conditions when the needle having a diameter of 1 mm is touched on the image receiving sheet from which the image receiving layer is removed with a load of 10 g and the temperature is risen at a rate of 5° C. per minute;

$$\{(\text{Position at }25°\text{ C.}-\text{Position at }30°\text{ C.})/\text{Position at }25°\text{ C.}\}\times 100\%\leqq 5\%$$

$$\{(\text{Position at }25°\text{ C.}-\text{Position at }130°\text{ C.})/\text{Position at }25°\text{ C.}\}\times 100\%\geqq 50\%.$$

The image receiving sheet of wherein variation of position of a point of a needle satisfies the following conditions when the needle having a diameter of 1 mm is touched on the surface of lower layer of the image receiving sheet with a load of 10 g and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 5\%$$

$$\{(\text{Position at } 25°\text{ C.}-\text{Position at } 130°\text{ C.})/\text{Position at } 25°\text{ C.}\}\times 100\% \geqq 50\%.$$

The image receiving sheet wherein the lower layer contains a thermoplastic resin having a TMA softening point of less than 100° C. and a compound having a melting point of less than 150° C.

The image receiving sheet wherein difference between melting point of the thermoplastic resin and TMA softening point of the thermoplastic resin is not less than 50° C.

The image receiving sheet wherein content of the thermoplastic resin is not less than 50 weight % with respect to the weight of the lower layer and content of the compound having a melting point of less than 150° C. is 10 to 50 weight % with respect to the weight of the lower layer.

The image receiving sheet wherein penetration rate of the needle into the compound having a melting point of less than 150° C. at the melting point of the compound is not less than 50 μm/min.

The image receiving sheet wherein the lower layer contains a thermoplastic resin having a TMA softening point of 30 to 100° C. and having a melting point of 80 to 150° C. and difference between melting point and TMA softening point of the thermoplastic resin is less than 50° C.

The image receiving sheet wherein content of the thermoplastic resin is not less than 50 weight % with respect to the weight of the lower layer.

The image receiving sheet wherein the image receiving layer contains a thermoplastic resin and a matting agent.

The image receiving sheet wherein an interlayer is provided between the lower layer and the image receiving layer and the adhesion force between the lower layer and the inter layer is larger than the adhesion force between the interlayer and the image receiving layer.

The image receiving sheet wherein the interlayer has a thickness of from 0.2 to 15 μm and a glass transition point Tg of not less than 80° C. or a tensile strength of not less than 3.5 $kg/cm^2$.

The image receiving sheet wherein the interlayer has a thickness of from 0.2 to 15 μm and a glass transition point Tg of 80 to 140° C. or a tensile strength of not less than 3.5 to 5.0 $kg/cm^2$.

The image receiving sheet wherein Vickers hardness of the image receiving layer is smaller than that of the lower layer at an ordinary temperature.

The image receiving sheet wherein Vickers hardness of the image receiving layer is smaller than that of the interlayer at an ordinary temperature.

The image receiving sheet wherein thermal transfer is induced by laser light irradiation.

A thermal transfer recording method comprising steps of contacting an image receiving sheet to an ink sheet, imagewise-heating of the contacted image receiving sheet and the ink sheet, whereby ink of the ink sheet is transferred imagewise to the image receiving sheet, separating the ink sheet from image receiving sheet, contacting the image receiving sheet having transferred ink image to a final transferee, and transferring the image formed on the image receiving sheet to the final transferee, wherein the image receiving sheet for thermal transfer recording comprising a support having thereon a lower layer and an image receiving layer are provided in this order from the support, wherein variation of position of point of a needle satisfies the following conditions when the needle having a diameter of 1 mm is touched on the image receiving sheet with a load of 10 g and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 5\%$$

$$\{(\text{Position at } 25°\text{ C.}-\text{Position at } 130°\text{ C.})/\text{Position at } 25°\text{ C.}\}\times 100\% \geqq 50\%.$$

The thermal transfer recording method wherein imagewise-heating of the contacted image receiving sheet and the ink sheet is induced by laser light exposure.

The thermal transfer recording method wherein the image is transferred to the final transferee by transferring the image receiving layer of the image receiving sheet for thermal transfer recording.

DETAIL DESCRIPTION OF THE INVENTION

Figure 1:
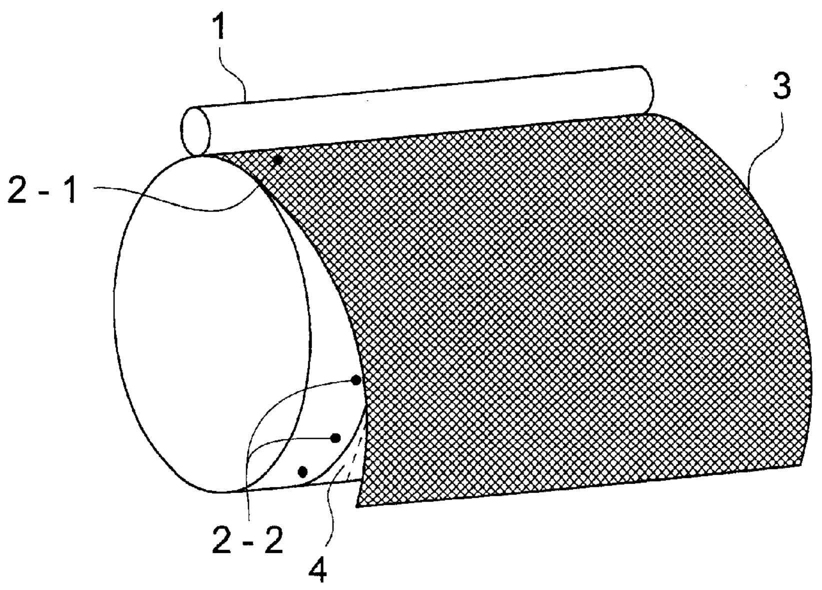
FIG. 1 shows an oblique view of the situation of the image receiving sheet winded on a dram-shaped sucking device in pile with the recording element.

1. An image receiving sheet for laser thermal transfer recording comprising a support having thereon a lower layer and an image receiving layer are provided in this order from the support, and the variation of the position of the point of a needle satisfies the following conditions when the needle having a diameter of 1 mm is touched on the image receiving sheet with a load of 10 g and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 5\%$$

$$\{(\text{Position at } 25°\text{ C.}-\text{Position at } 130°\text{ C.})/\text{Position at } 25°\text{ C.}\}\times 100\% \geqq 50\%.$$

2. An image receiving sheet for laser thermal transfer recording comprising a support having thereon a lower layer and an image receiving layer are provided in this order from the support, and the variation of the position of the point of a needle satisfies the following conditions when the needle having a diameter of 1 mm is touched on the surface of the lower layer with a load of 10 g, and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 5\%$$

$$\{(\text{Position at } 25°\text{ C.}-\text{Position at } 130°\text{ C.})/\text{Position at } 25°\text{ C.}\}\times 100\% \geqq 50\%.$$

3. An image receiving sheet for laser thermal transfer recording comprising a support having thereon a lower sheet and an image receiving layer are provided in this order from the support in which the lower layer contains a thermoplastic resin having a TMA softening point of less than 100° C. and a compound having a melting point of less than 150° C.

Preferable embodiments of the above-mentioned are shown below.

The penetration rate of the needle into the compound having a melting point of less than 150° C. at the melting point of the compound is not less than 50 μm/min.

The image receiving layer contains a matting agent and a thermoplastic resin.

An interlayer is provided between the lower layer and the image receiving layer and the adhesion force between the lower layer and the inter layer is larger than the adhesion force between the interlayer and the image receiving layer.

The interlayer has a glass transition point Tg of not less than 75° C. or a tensile strength of not less than 3.5 kg/m$^2$, and a thickness of from 0.2 to 10 μm.

The Vickers hardness of the image receiving layer is smaller than that of the lower layer or that of the interlayer at an ordinary temperature.

The image receiving element is used as the intermediate transfer medium for transferring image formed thereon onto a final image receiving element.

4. A thermal transfer recording method by which an image formed on the image receiving layer of the image receiving sheet for laser thermal transfer recording described in one of 1 to 3 is transferred onto the final image receiving element.

DETAILED DESCRIPTION OF PREFERRED EMBODIMENT

The image receiving sheet for thermal transfer recording according to the invention has a support, a lower layer and an image receiving layer. The image receiving sheet for thermal transfer recording of the invention is preferably an image receiving sheet to be used for laser thermal transfer recording. Moreover, an embodiment is also included in the thermal transfer according to the invention, in which the transfer of the image is performed by heat generated by light-heat conversion by a light-heat conversion agent contained in the ink sheet or the image receiving sheet when the exposure is given. In the invention, the "lower layer" is a layer other than the image receiving layer, which is provided at a position nearer the support than the image receiving layer. A preferable example of the lower layer is a cushion layer such as a thermally softenable layer.

In the invention, the process for transferring an image to the image receiving layer according to the invention by contacting an ink sheet having a fusible ink layer to the image receiving sheet having the image receiving layer is referred to a primary transfer process, and the process for transferring the image formed on the image receiving sheet onto a final image receiving element such as paper is referred to a secondary transfer process.

In the image receiving sheet for laser thermal transfer recording according to the invention, at least a lower layer and an image receiving layer are laminated on a support in this order from the support, and is characterized in that the components of the image receiving layer or the lower layer are solid state with a low fluidity at an ordinary temperature, and the deformation per unit layer thickness and time of the lower layer is smaller than that of the image receiving layer and the fluidity of the lower layer is considerably risen when the sheet is heated.

According to the above-mentioned, the object of the invention that to form an image having a uniform density with a high sensitivity and no image defect can be attained, and a high suitability to paper having a high roughness or a large undulation such as mat paper can be attained since the fluidity thereof is considerably risen at the time of secondary transfer.

The constitution pattern of the each layers of the image receiving sheet for laser thermal transfer recording, hereinafter simply referred to image receiving sheet, are shown below. In the followings, the lower layer is described as thermally softenable layer. a. Support/Thermally softenable layer/Image receiving layer b. Support/Thermally softenable layer with a high needle position variation/Thermally softenable layer with a low needle position variation/Image receiving layer c. Support/Thermally softenable layer with a low needle position variation/Thermally softenable layer with a high needle position variation/Image receiving layer d. Support/Thermally softenable layer/Interlayer/Image receiving layer e. Support/Thermally softenable layer with a high needle position variation/Thermally softenable layer with a low needle position variation/Interlayer/Image receiving layer f. Support/Thermally softenable layer with a low needle position variation/Thermally softenable layer with a high needle position variation/Interlayer/Image receiving layer The image receiving sheet according to the invention is described below.

(1) An image receiving sheet for laser thermal transfer recording comprising a support having thereon a lower layer and an image receiving layer are provided in this order from the support, and the variation of the position of the point of a needle satisfies the following conditions when the needle has a diameter of 1 mm and is touched on the image receiving sheet with a load of 10 g, and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 5\%$$

$$\{(\text{Position at } 25°\text{ C.}-\text{Position at } 130°\text{ C.})/\text{Position at } 25°\text{ C.}\}\times 100\% \geqq 50\%.$$

(2) As another embodiment of the image receiving sheet, it is preferable that the image receiving sheet for laser thermal transfer recording comprises a support having thereon a lower layer and an image receiving layer are provided in this order from the support, and the variation of the position of the point of a needle having a diameter of 1 mm which is stand on the image receiving sheet with a load of 10 g, accompanied with the temperature rising in a rate of 5° C. per minute satisfies the following conditions is preferable.

(3) As another embodiment of the image receiving sheet, it is preferable that the image receiving sheet for laser thermal transfer recording comprises a support having thereon a lower sheet, and the lower layer contains a thermoplastic resin having a TAM softening point of less than 100° C. and a compound having a melting point of less than 150° C.

(4) As another embodiment of the image receiving sheet, an image receiving sheet for laser thermal transfer recording comprising a support having thereon a lower layer and an image receiving layer in this order from the support in which and the variation of the position of the point of a needle preferably satisfies the following conditions when the needle having a diameter of 1 mm is touched on surface of the image receiving sheet from which the image receiving layer is removed with a load of 10 g and the temperature is risen at a rate of 5° C. per minute.

(Image Receiving Sheet)

The image receiving sheet according to the invention principally comprises a support having thereon a lower and a image receiving layer, and receive an ink layer imagewise transferred from a recording element to form an image.

The image receiving sheet preferably has a suitable heat resistivity and a sufficient dimension stability so as to suitably form an image.

It is preferable that the image receiving layer of the image receiving sheet of the invention is constituted so that the variation of the position of the point of a needle satisfies the following conditions when the needle having a diameter of 1 mm is touched to the image receiving sheet, particularly to the surface of the image receiving layer side of the image receiving sheet, with a load of 10 g and the temperature is risen at a rate of 5° C. per minute.

$$\{(\text{Position at } 25^\circ\text{ C.}-\text{Position at } 30^\circ\text{ C.})/\text{Position at } 25^\circ\text{ C.}\}\times 100\% \leqq 5\%$$

$$\{(\text{Position at } 25^\circ\text{ C.}-\text{Position at } 130^\circ\text{ C.})/\text{Position at } 25^\circ\text{ C.}\}\times 100\% \geqq 50\%.$$

In the invention, the variation of the position of the point of the needle at 30° C. and 130° C. can be determined by the variation of the needle position caused by the temperature rising in the course of measuring the TMA softening point, namely the softening point measured by a thermomechanical analysis.

The variation ratio of the position of the needle point is defined by the ratio of the variation value of at 30° C. and that at 130° C. to the thickness of whole layers at the image receiving layer side of the image receiving sheet. The variation value of at 30° C. and that at 130° C. are each determined with respect to the position at 25° C. as the standard. The variation ratio is not more than 5%, preferably not more than 3%, at 30° C., and not less than 50%, preferably not less than 60%, at 130° C.

The position of the needle point is concretely described below. For example, the position of the needle point at 25° C. is 125 μm when the thickness of whole layers at the image receiving layer side of the image receiving sheet (thickness of image receiving sheet excluding a support and a backing layer) is 125 μm C measured by touching a needle having a diameter of 1 mm to the surface with a load of 10 g at 25° C. If the point of the needle is penetrated by 1 μm when the temperature is risen by 30° C. while applying a load of 10 g, the position of the needle point at 30° C. is 124 μm. Furthermore, if the point of the needle is penetrated by 80 μm from the position at 25° C. when the temperature is risen by 130° C. while applying a load of 10 g, the position of the needle point at 130° C. is 45 μm. In such the case, therefore, $$\{(\text{Position at } 25^\circ\text{ C.}-\text{Position at } 30^\circ\text{ C.})/\text{Position at } 25^\circ\text{ C.}\}\times 100\% \leqq 5\%$$

$$\{(\text{Position at } 25^\circ\text{ C.}-\text{Position at } 130^\circ\text{ C.})/\text{Position at } 25^\circ\text{ C.}\}\times 100\% \geqq 50\%.$$

a) Image receiving layer

The image receiving layer comprises a binder, a matting agent and various additives which are added according to necessity. The binder is preferably a thermoplastic resin.

The image receiving layer formed on the image receiving sheet according to the invention preferably has a softening point measured by TMA measurement of not more than 100° C., for example one containing a thermoplastic resin having a TMA softening point of not more than 100° C. The softening point is more preferably-not more than 80° C., further preferably not more than 60° C.

The TMA softening point can be determined by observing the phase of a objective matter according to the rising of the temperature at a constant temperature rising rate while a constant load is applied.

In the invention, the TMA softening point is defined by the temperature at which variation of the position of the needle touched to the objective matter is started. The measurement of the softening point by TMA can be an apparatus such as Thermoflex manufactured by Rigaku Denki Co., Ltd. For example, the temperature at which the variation of the needle position is started when Thermoflex is used and the temperature range for the measurement is set from 25° C. to 200° C., the temperature rising rate is set at 5° C. per minute and a constant loading is applied to a quartz glass pin having a diameter of 1 mm.

Concrete examples of the binder to be used in the image receiving layer include a adhesive such as a polyvinyl acetate emulsion type adhesive, a chloroprene type adhesive and an epoxy resin type adhesive, a tacking agent such as a natural rubber type, a chloroprene rubber type, a butyl rubber type, a polyacrylate type, a nitrile rubber type, a polysulfide type, a silicone rubber type and a petroleum type resin, a reclaimed rubber, a vinyl chloride type resin, SBR, a polybutadiene resin, a polyisoprene, a polyvinylbutyral resin, a polyvinyl ether, an ionomer resin, SIS, SEBS, an acryl resin, an ethylene copolymer, an ethylene-vinyl chloride copolymer, an ethylene-acryl copolymer, an ethylene-vinyl acetate (EVA) resin, a vinyl chloride grafted EVA resin, an EVA grafted vinyl chloride resin, a vinyl chloride resin, various modified olefins and a polyvinylbutyral.

The above-mentioned resins may be used singly or in combination of two or more kinds. An additive may be accompanied.

In the invention, the sensitivity can be risen by lowering the TMA softening point of the image receiving layer. However, the fogging tends to be formed in such the case. Moreover, it is advantageous to add a matting agent into the image receiving layer for the purpose of removing a gas generated accompanied with the exposure when a large size image is output. The average size of the matting agent is preferably larger from 0.3 to 10.0 μm, more preferably from 0.3 to 8.0 μm. particularly preferably from 1 to 5.5 μm, than the average thickness of the layer containing no matting agent.

The effects of the matting agent on the gas removing and the fogging are decreased when the average size thereof is less than 0.3 μm, and the sensitivity is lowered when the diameter exceeds 10.0 μm. It is preferable that the matting agent has a size distribution in which the weight of the particles having a diameter more than 2 times of the average diameter is not more than 20%, more preferably 5%.

The deterioration during storage such as blocking can be inhibit by the use of the matting agent in which the weight of the particles having a diameter more than 2 times of the average diameter is not more than 20% since the pressure is uniformly mitigated. The use of the matting agent in which the weight of the particles having a diameter more than 2 times of the average diameter is not more than 5% is more preferable from the viewpoint of the storage ability.

When such the matting agent is selected, the thickness of the image receiving layer is preferably not more than 3.0 μm since the image is made yellowish by the presence of excessive amount of the matting agent when the thickness is more than 3.0 μm and the matting agent is added so that the amount of the matting agent is suited to the thickness of the layer. The thickness of the image receiving layer is preferably not less than 0.1 μm.

Both of an organic and an inorganic matting agents can be used, and fine particle of known organic materials such as an acryl resin such as a poly(methyl methacrylate) (PMMA), a fluorinated resin and a silicone resin are usable. A cross-linked organic fine particle is further preferable for rising the strength and the solvent resistivity of the particle.

The distribution of the matting agent at the surface of the image receiving layer is also important, and the number of the matting agent particle at the surface of the receiving layer is preferably within the range of from 200/mm$^2$ to 2400/mm$^2$. The effect of the matting agent is enhanced when the particle of the matting agent has a regular sphere shape. The regular sphere shape in the invention means that the shape of the particle by a microscopic observation is approximately sphere and the difference of the major diameter and the minor diameter is approximately 20% or less.

In the invention, it is preferable that the Vickers hardness of the image receiving layer at an ordinary temperature is lower than that of the later-mentioned under layer or that of interlayer.

When the Vickers hardness of a layer arranged under the image receiving layer is lower than that of the image receiving layer, blocking during the storage of the image receiving sheet tends to be caused. Particularly, in the system in which the matting agent is added, the subsidence of the matting agent causes the lacking of uniformity of image and the defect formation in the image.

b) Lower Layer

A material having an elasticity without fluidity at an ordinary temperature is preferably used for the lower layer, and the material is required to change at a high temperature region exceeding 100° C. so as to show a notable fluidity.

To the image receiving sheet, it is required to have a lower layer in which the variation of the needle position satisfying the following conditions when the needle having a diameter of 1 mm is touched to the lower layer with a load of 10 g and the temperature is risen at a rate of 5° C. per minute.

$$\{(\text{Position at }25°\text{ C.}-\text{Position at }30°\text{ C.})/\text{Position at }25°\text{ C.}\}\times 100\%\leqq 5\%$$

$$\{(\text{Position at }25°\text{ C.}-\text{Position at }130°\text{ C.})/\text{Position at }25°\text{ C.}\}\times 100\%\geqq 50\%.$$

The lower layer may be constituted by a single material or plural materials as long as the above-mentioned properties of the layer can be attained.

In the invention, the variation value of the position of the needle point at 30° C. and 130° C. can be each determined based on the variation of the position of the needle point in the course of the temperature rising in the TMA softening point measurement. The TMA softening point is the same as in the description of the image receiving layer.

The ratio of the variation of of the needle position is defined by a ratio of the needle position variation value at 30° C. and that at 130° C. to the thickness of the image receiving layer. The variation value of at 30° C. and that at 130° C. are each determined based on the position at 25° C. as the standard. The variation ratio is not more than 5%, preferably not more than 3%, at 30° C. and not less than 50%, preferably not less than 60%, at 130° C.

In the invention, the lower layer or thermally softenable layer with "a high needle position variation" is a layer having a changing ratio of the position of the needle of not less than 60% at 130° C., and the lower layer with "a low needle position variation" is a layer having a variation ratio of the position of the needle of less than 60% at 130° C.

The above-mentioned properties the lower layer is attained not only with respect to one constituted by the support having thereon the lower layer, but the also attained with respect to a sample of the lower layer prepared by removing the image receiving layer from the image receiving sheet by a adhesive tape or another means.

The invention is characterized in that the lower layer having the above-mentioned properties is formed on the support.

Preferable examples of the later-mentioned thermoplastic resin having a TMA softening point less than 100° C. to be used together with the compound having a melting point of less than 150° C., and that having a TMA softening point of not less than 30° C. and less than 100° C., a melting point of not less than 80° C. and not more than 150° C., and the difference between the melting point and the TMA softening point is less than 50° C. are described below.

Although the preferable properties of the lower layer according to the invention is not always limited by the kind of material, examples of the material having a preferable property include an ethylene copolymer, an ethylene-vinyl acetate copolymer, an ethylene-ethylene acrylate copolymer, a polybutadiene resin, a styrene-butadiene copolymer (S), a styrene-ethylene-butene-styrene copolymer (SEBS). an acrylonitrile-butadiene copolymer (N), a polyisoprene resin (IR), a styrene-isoprene copolymer (SIS), an acrylate copolymer, a polyester resin, a polyurethane resin, an acryl resin, a butyl rubber and a polynorbornene.

Among them, ones having a relative low molecular weight tend to satisfy the requirement of the invention. However, the molecular weight cannot be limited since the property of the material is also changed depending on the kind thereof.

Moreover, the content of the thermoplastic resin having a TMA softening point of less than 100° C. is preferably not less than 50%, more preferably not less than 70%, by weight of the lower layer. The content of the compound having a melting point of less than 150° C. is preferably within the range of from not less than 10% to not more than 50% by weight of the lower layer. The TMA softening point of the thermoplastic resin having a TMA softening point of less than 100° C. is preferably not less than 30° C., more preferably not less than 45° C., further preferably not less than 60° C. The melting point of the compound having a melting point of less than 150° C. is preferably within the range of from 40° C. to 130° C., more preferably from 70° C. to 110° C. When the compound having a melting point of less than 150° C. is contained, the difference between the melting point and the TMA softening point of the thermoplastic resin having a TMA softening point of less than 100° C. is preferably not less than 50° C.

Another preferred embodiment of the constituting composition of the image receiving sheet according to the invention is that the lower layer contains a thermoplastic resin of which the TMA softening point is not less than 30° C. and less than 100° C., the meting point is less than 80° C. and not more than 150° C. and the difference between the melting point and the TMA softening point is less than 50° C. The difference between the melting point and the TMA softening point is preferably not more than 40° C., more preferably 30° C.

Further, fluid velocity of the thermoplastic resin at melting point is preferably 5 $\mu$m/min or more.

The content of such the thermoplastic resin is preferably not less than 50% by weight of the lower layer. In such the case, the compound having a melting point of less than 150° C. may not be contained.

The limitation of the melting point in the invention of course include a material in a liquid state at 25° C. and the melting point of a material in a semi-solid or solid state at 25° C. is determined by detecting the peak on the differential curve of the changing value of the position of needle point in the course of measurement of the TMA softening point.

Such the material can be used without any limitation by suitably mixing with the thermoplastic resin having a TMA softening point of less than 100° C.

As above-mentioned, it is considerably preferable embodiment to used a thermoplastic resin having a TMA softening point of less than 100° C. and a compound having a melting point of less than 150° C. in combination, and it is also one of preferable embodiments to use such the material singly or two or more kinds of them in combination.

Moreover, an embodiment is also particularly preferred, in which the lower layer contains a thermoplastic resin having a TMA softening point of not less than 30° C. and less than 100° C. and a melting point of from 80° C. to 150° C., and the difference between the melting point and the TMA softening point is less than 50° C.

Although there is no limitation on the compound having a melting point of less than 150° C., concrete examples thereof include a polyolefin compound such as a ethylene copolymer, and an olefin copolymer such as an ethylene-vinyl acetate copolymer, and an ethylene-ethyl acrylate copolymer. Such the compounds each can be used by mixing with the resin having a TMA softening point of less than 100° C.

In the invention, it is preferable that the needle penetration rate to the compound having a melting point of less than 150° C. at the melting point is not less than 50 μm/minute. The needle penetration rate at the melting point can be converted from the changing value of the needle point position at the peak of the differential curve by the following equation.

Needle Penetration Rate (μm/min.)=Changing value of the needle point position at the peak of the differential curve×Sensitivity of apparatus×Changing value–Thickness conversion coefficient A high penetration rate, such as 550 μm/min. or more, enhances the suitability to the final support at the secondary transfer.

The preferable properties of the lower layer can also be obtained by addition of various additives, other than the use of the above-mentioned materials.

Examples of the additive include a substance having a low melting point such as a wax, a plasticizer, a thermal solvent and a tackifier.

Among them one being in a solid state at an ordinary temperature is preferable, and one having a malting point of from 40 to 130° C. is preferable and one having a melting point of from 70 to 110° C. is more preferable.

The wax may be used in a molten form by mixing with the thermoplastic resin having a TMA softening point of less than 100° C., or in a form of dispersion in the thermoplastic resin. When the wax is existed in the form of dispersion in the resin, the average diameter of dispersed particles of the wax itself is preferably fine. The average diameter is preferably from 0.01 to 3 μm, more preferably from 0.05 to 1 μm.

When such the wax being in a solid state at an ordinary temperature is used, the wax may be used in the range of adding amount of from 1 to 70%, more preferably from 5 to 50% by weight. The adding amount of a wax being in a liquid state at an ordinary temperature is preferably not more than 10%, more preferably not more than 5% by weight.

Examples of the plasticizer, the heat solvent and the tackifier include a phthalic ester, an adipic ester, a glycol ester, an fatty acid ester, a phosphoric acid ester and a chlorinated paraffin. Various additives, for example, described in "Practical Hand Book of Additives for Plastics and Rubber" Kagaku Kogyo Sha, 1960, can be added.

The adding amount of such the additives may be optionally decided so that the preferable properties can be obtained by the combination with the material of the lower layer as the base material.

The lower layer can be formed by providing the materials dissolved in a solvent or dispersed in a latex state by a blade coater, a roller coater, a bar coater, a curtain coater or a gravure coater, or by a extruding lamination of hot-molten materials.

The thickness of the lower layer is preferably not less than 5 μm, more preferably not less than 10 μm. When the thickness of the lower layer is less than 5 μm. the lacking of image tends to be occurred at the time of the retransfer to the final transferring element. The thickness of the lower layer is preferably not more than 50 μm.

c) Interlayer

In the invention, it is preferred embodiment that an interlayer is provided between the lower layer and the image receiving layer in which the interlayer has the following relation of adhesive force. The adhesive force between the lower layer and the interlayer is larger than the adhesive force between the interlayer and the image receiving layer. It is preferable embodiment to form a composite lower layer including the lower layer and the interlayer.

The binder of the inter layer includes polyester, polyvinyl acetal, polyvinyl formal, polyparabanic acid, polymethylmethacrylate, polycarbonate, ethylcellulose, nitrocellulose, methylcellulose, carboxymethylcellulose, hydroxypropylcellulose, polyvinyl alcohol, polyvinyl chloride, polystyrene, acrylonitrile styrene or their cross-linked polymers, a heat hardenable resin having a Tg of 65° C. or more such as polyamide, polyimide, polyetherimide, polysulfone, polyethersulfone or aramid or their hardened resin. The cross-linking agent includes a conventional one such as isocyanate or melamine.

The binder of the inter layer is preferably polycarbonate, acetal, or ethylcellulose in view of storage stability, and it is more preferable that when an acryl resin is used in the image receiving layer, releasing is excellent in re-transferring an image transferred after a laser heat transfer.

When the Tg of the binder is not less than 140° C. or the tensile strength of that is not less than 5.0 kg/cm$^2$ the thickness of the interlayer is preferably from 0.2 to 10 μm, and when the Tg of the binder is from 80 to 140° C. or the tensile strength of the binder is from 3.5 to 5.0 kg/cm$^2$, the thickness is preferably from 0.2 to 15 μm.

A layer, of which adhesiveness with the image receiving layer is become considerably low at a cooled condition, can be used as the interlayer When the average diameter, the adding amount, the shape and the material of the matting agent contained in the image receiving layer is suitably controlled. In concrete, a layer principally comprising a thermally fusible compound or a thermally fusible resin such as a wax or a binder can be used as the interlayer. Examples of the thermally fusible compound include those described in JP O.P.I. No. 63-193886. Particularly, microcrystalline wax, paraffin wax and carnauba wax are preferably used. An ethylene copolymer such as an ethylene-vinyl acetate copolymer, and a cellulose resin are preferably used as the thermoplastic resin.

The interlayer can be formed by coating the materials dissolved in a solvent or dispersed in latex form on the lower layer applying a coating means such as a blade coater, a roller coater, a bar coater, a curtain coater or a gravure coater, or a lamination means using hot molten extruder. Moreover, a method is usable, in which the materials dissolved in a solvent or dispersed in a latex is coated on a temporary base and the coated matter is adhered with the lower layer, then the temporary base is peeled off.

d) Support of the Image Receiving Sheet

Any materials can be used as the support of the image receiving sheet as long as the materials have a suitable dimensional stability and a sufficient resistivity to heat at the time of the image formation. Accordingly, known supports may be optionally selected without any limitation, and the material, the layer structure and the size thereof may be optionally selected according to the purpose of the use.

The support preferably satisfies the following condition. Variation of position of point of a needle satisfies the following conditions when the needle having a diameter of 1 mm is touched on the support with a load of 10 g and the temperature is risen at a rate of 5° C. per minute;

$$\{(\text{Position at } 25°\text{ C.}-\text{Position at } 30°\text{ C.})/\text{Position at } 25°\text{ C.}\}\times 100\% \leqq 1\%$$

Examples of usable support include paper, coated paper, synthesized paper such as propylene, polystyrene and a composite material prepared by pasting one of them and paper, a plastic film or sheet such as a vinyl chloride resin sheet, an ABS resin sheet, a poly(ethylene terephthalate) film, a poly(butylene terephthalate) film, a poly(ethylene naphthalate) film, a polyallylate film, polycarbonate film, a poly(ether ketone) film, a polysulfone film, a poly(ether sulfone) film, a poly(ether imide) film, a polyimide film, a polyethylene film, a polypropylene film, a polystyrene film, an extended nylon film and a polyacetate film, a film or sheet composed of a metal, a film or sheet composed of ceramics, a plate of a metal such as aluminum, stainless steel, chromium or nickel, paper coated with a resin and evaporated with a metal thin layer, and white PET sheet including a white pigment. Known technique for improving the surface property can be suitably applied to such the support.

In the invention, the use of a support treated by a adhesion treatment or that having an adhesive layer is preferable for stabilizing the adhesion with the lower layer.

Examples of the adhesion treatment include a flame treatment, a sulfric acid treatment, a corona discharge treatment and a plasma treatment. Among them, the corona discharge treatment is preferred. The strength of the corona treatment is preferably from 20 to 80 W/m$^2$, particularly preferable from 30 to 70 W/m$^2$.

As the adhesive layer, known ones can be used without any limitation. The adhesive layer can be provided by a coating a resin dissolved in an aqueous system, a resin dissolved in a solvent, an aqueous latex or a hot molten materials.

The thickness of the support is preferably from 25 to 200 $\mu$m, more preferably from 25 to 100 $\mu$m.

A backing layer may be provided on the back side, the side opposite to the side on which the image receiving layer is provided, for giving a function such as a running stability, a heat resistivity and an antistatic property.

e) Backing Layer

An antistatic agent is used in the backing layer for preventing the triboelectricity. As the antistatic agent, for example, carbon black, graphite, a metal oxide such as tin oxide and titanium oxide and an electroconductive fine particle such as an organic semi-conductor are preferably usable. The use of the electroconductive fine particle is particularly preferred since the antistatic agent is not released from the backing layer and the stable antistatic effect can be obtained without dependency on the atmosphere condition such as the temperature.

The image receiving sheet of the invention is exactly contacted with the recording medium for recording an image. Therefore, it is preferable that rough the backing layer is roughened so as to adjust the Smoostar value (sucking pressure measured by Smoostar meter) to a suitable value.

For example, the following method can be applied for obtaining the suitable Smoostar value.

(a) To rough the backing layer surface by an embossing treatment after providing the backing resin layer.

(b) To rough the surface of the backing layer by adding a matting agent into the backing layer.

(c) To use a support previously having a roughened surface and a backing layer having a thickness smaller than the deepness of the roughness is laminated on the roughened surface so as to form the surface of the backing layer at which the roughness is remained.

Particularly, the use of a smooth film or sheet is preferred for the thermal transfer recording required a fine precise image. Therefore, it is preferable to make a surface having a suitable sucking pressure by the method of (b). In the invention, a sucking pressure of not more than 300 mmHg, more preferably not more than 150 mmHg, is preferable.

The sucking pressure of the backing layer surface can be measured by Smoostar SM-6B manufactured by Toei Denki Kogyo Co., Ltd.

The binder used in the back coat layer includes a polymer such as gelatin, polyvinyl alcohol, methylcellulose, nitrocellulose, acetylcellulose, an aromatic polyamide resin, a silicone resin, an epoxy resin, an alkyd resin, a phenol resin, a melamine resin, a fluorine-containing resin, a polyimide resin, a polyurethane resin, an acryl resin, a urethane modified silicone resin, a polyethylene resin, a polypropylene resin, Teflon, a polyvinyl butyral resin, a polyvinyl chloride resin, polyvinyl acetate, polycarbonate, an aromatic polyester, a fluorinated polyurethane or polyether sulfone.

It is effective for prevention of separation of the matting agent from the back coat layer or improved anti-scratch of the back coat layer to use a cross-linkable water soluble binder in the back coat layer and cross-link the binder. It is also effective for blocking during storage.

According to characteristics of a cross-linking agent used, the cross-linking is carried out by heat, an active ray, pressure or its combination but with no special limitations. An adhesive layer may be provided between the back coat layer and the support to give an adhesion property to the support.

The matting agent preferably used in the back coat layer includes organic or inorganic fine particles. The organic matting agent includes fine particles such as polymethyl methacrylate (PMMA), polystyrene, polyethylene, polypropylene or other radical polymerization polymers and polycondensation polymer fine particles such as polyesters and polycarbonates.

The coating weight of the back coat layer is preferably 0.5 to 3 g/m$^2$. In the range, coating characteristics are stable and matting particles are fixed, and gives clear image without unevenness etc.

The number average particle size of the matting agent is preferably 2.5 $\mu$m or more, and more preferably 2.5 to 20 $\mu$m, larger than the thickness of the back coat layer containing only a binder resin. The back coat layer containing a matting agent having a particle size of 8 $\mu$m or more in an amount of 5 mg/m$^2$, preferably 6 to 600 mg/m$^2$ minimizes foreign matter problems. It has been proved that the matting agent having a value obtained by dividing standard deviation by the number average particle size, $\sigma/r_n$ (variation coefficient of particle size) of 0.3 or less, which has a narrow particle size distribution, solves a problem which occurs is caused by a matting agent of too large particle size and further can attain an intended object in a small amount. The variation coefficient is more preferably 0.15 or less.

The back coat layer preferably contains an anti-static agent in order to prevent foreign matter adherence due to frictional electrification caused during contact with a transport roller. Content of the anti-static agent is determined so that the surface specific resistance of a layer or a support of the intermediate transfer medium is $10^{12}\Omega/m^2$ at 80% RH.

A mold releasing agent such as a surfactant, a silicone oil and a fluorinated resin may be added into the backing layer to give a coating suitability and a releasing ability.

(Recording Element for Heat-mode Laser Thermal Transfer)

A recording element for the heat-mode laser thermal transfer recording to be used with the image receiving sheet according to the invention is described below.

The recording element comprises at least a support having thereon an ink layer having a light-heat conversion ability or a combination of a light-heat conversion layer and an ink layer. Moreover, a thermally softenable layer or an interlayer are provided between the support and such the layers according to necessity.

Supports similar to those usable for the image receiving sheet can be used to the support of the recording element. The support is preferably transparent when an image is formed by laser light irradiated from the recording element side.

It is not necessary that the support is transparent when laser light is irradiated from the image receiving sheet side to form an image.

The thermally softenable layer is provided for rising the contacting ability with the image receiving sheet. The thermally softenable layer is a layer having a thermally softening ability or a elasticity. A material capable of sufficiently being softened by heating, that having a low elastic modulus or that having a rubber elasticity may be used for the heat softenable layer. In concrete, polymers similar to those usable in the lower layer (the thermally softenable layer) of the image receiving sheet are usable.

The thermally softenable layer is formed by coating, laminating or pasting up, and may be finished by coating to making a smoothness of the surface.

The thermally softenable layer may be formed by a method similar to that for forming the image receiving layer of image receiving sheet. A void structured resin layer can be used as the specific thermally softenable layer, which is formed by a thermally softenable or thermoplastic resin. When a sized thermally softenable layer essentially having a high surface smoothness is provided, the layer is preferably formed by coating by means of various coating procedures. The total thickness of the thermally softenable layer is preferably not less than 0.1 $\mu$m. more preferably not less than 0.3 $\mu$m.

The light-heat conversion layer is not necessary when a light-heat conversion substance can be added into the ink layer. However, the light-heat conversion layer is preferably provided separately from the ink layer consideration of the color reproducibility of the transferred image when the light-heat conversion substance is substantially not transparent. The light-heat conversion layer may be provided adjacent to the ink layer.

The light-to-heat converting compound is preferably a compound which absorbs light and effectively converts to heat, although different due to a light source used. For example, when a semi-conductor laser is used as a light source, a compound having absorption in the near-infrared light region is used. The near-infrared light absorbent includes an inorganic compound such as carbon black, an organic compound such as a cyanine, polymethine, azulenium, squalenium, thiopyrylium, naphthoquinone or anthraquinone dye, and an inorganic metal complex of phthalocyanine, azo or thioamide type. Specifically, the near-infrared light absorbent includes compounds disclosed in JP-A Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds can be used singly or in combination of two or more kinds thereof. Further, employed may be those in which the surface of carbon black is modified with a carboxyl group and sulfone group.

As the binder of the light-to-heat converting layer which works as the light-to-heat conversion layer, are used resins having high Tg and high heat conductivity. The binder includes common heat endurable resins such as polymethylmethacrylate, polycarbonate, polystyrene, ethylcellulose, nitrocellulose, polyvinylalcohol, polyvinyl chloride, polyamide, polyimide, polyetherimide, polysulfone, polyethersulfone, and aramid.

A water-soluble polymer can be also used as a binder in the light-to-heat converting layer. The water soluble polymer is preferable because it gives excellent peelability between the image forming layer and the intermediate layer, has high heat resistance while irradiating light, restrains scatter or abrasion of the intermediate layer when excessive heat is applied. When the water-soluble polymer is used, it is preferable that the light-to-heat converting compound is water-soluble (by incorporation of a sulfo group to the compound) or dispersed in water. Furthermore, various types of releasing agents are preferably incorporated into the light-to-heat converting layer. By incorporating the releasing agent, the intermediate layer can give excellent peelability between the image forming layer and the intermediate layer and can improve sensitivity. The releasing agent includes a silicone releasing agent (for example, a polyoxyalkylene modified silicone oil or an alcohol modified silicone oil), a fluorine-containing surfactant (for example, a perfluoro phosphate surfactant, and other various surfactants.

The light-to-heat converting compound content of the light-to-heat converting layer may ordinarily be determined in such a manner that the layer gives an optical density of preferably 0.3 to 3.0, more preferably 0.7 to 2.5 to light wavelength emitted from a light source used.

When the light-heat converting layer is poor in adhesiveness to a support, color mixture due to layer separation is likely to occur in peeling the recording material from the intermediate transfer material at the time of light irradiation or after heat transfer, therefore, an adhesive layer may be provided between the support and the light-heat converting layer.

It is preferable to select combination of materials so that the adhesion power between light-heat conversion layer and thermosoftening layer or between light-heat conversion layer and adhesion layer is larger than the ink peeling strength when ink transfers. A conventional adhesive such as polyester, urethane or gelatin may be used in the adhesive layer. Further, in order to obtain the above effect, a cushion layer containing a tackifying agent or an adhesive may be provided instead of the adhesive layer. The adhesive layer preferably is as thin as possible because the effect of the thermosoftening layer reduces when thermosoftening property is not sufficient in the adhesive layer.

The thickness of the light-to-heat converting is preferably 0.05 to 0.6 μm, to which is not restricted when the adhesive layer works as the thermosoftening layer.

As the light-heat converting layer, an evaporation layer may be used. The evaporation layer includes an evaporation layer of carbon black or metal black such as gold, silver, aluminum, chrome, nickel, antimony, tellurium, bismuth, or selenium-described in JP-A No. 52-20842. The light-heat conversion material may be a colorant employed in the ink layer, and various substances may be used without restriction to those exemplified above.

The colorant layer is a layer which contains a colorant and a binder and is melted or softened while heating to be transferred to another sheet, although the layer need not be completely melted to transfer.

The colorant includes inorganic pigment (for example, titanium dioxide, carbon black, graphite, zinc oxide, Prussian blue, cadmium sulfate, iron oxide, lead oxide, zinc oxide, and chromate of barium and calcium), organic pigment (for example, azo compounds, indigo compounds, anthraquinone compounds, anthanthrone compounds, triphenedioxazine compounds, vat dye pigment, phthalocyanine pigment or its derivative, and quinacridone pigment) and dyes (for example, acidic dyes, direct dyes, dispersion dyes, oil soluble dyes, metal-containing oil soluble dyes and sublimable dyes).

For example, as pigment for a color proof, C.I. 21095 or C.I. 21090 is used as a yellow pigment, C.I. 15850:1 as a magenta pigment, and C.I. 74160 as a cyan pigment.

The colorant content in the colorant layer may be adjusted in such a manner that an intended content can be obtained based on the intended coating thickness, and not specifically limited. The colorant content of the colorant layer is ordinarily 5 to 70% by weight, and preferably 10 to 60% by weight.

The binder of the colorant layer includes a heat fusible compound, a heat softening compound, and a thermoplastic resin. The heat fusible compound is a solid or semi-solid compound having a melting point of 40 to 150° C., the melting point measured by means of a melting point apparatus, Yanagimoto JP-2, and includes waxes, for example, vegetable wax such as carnauba wax, Japan wax, or esparto wax, animal wax such as bees wax, insect wax, shellac wax or spermaceti, petroleum wax such as paraffin wax, microcrystalline wax, polyethylene wax, ester wax or acid wax, and mineral wax such as montan wax, ozocerite or ceresine. The binder further includes a higher fatty acid such as palmitic acid, stearic acid, margaric acid or behenic acid, a higher alcohol such as palmityl alcohol, stearyl alcohol, behenyl alcohol, margaryl alcohol, myricyl alcohol or eicosanol, a higher fatty acid ester such as cetyl palmitate, myricyl palmitate, cetyl stearate or myricyl stearate, an amide such as acetamide, propionic amide, palmitic amide, stearic amide or amide wax, and a higher amine such as stearyl amine, behenyl amine or palmityl amine.

The thermoplastic resin includes, for example, an ethylene copolymer, a polyamide resin, a polyester resin, a polyurethane resin, a polyolefin resin, an acryl resin, a polyvinyl chloride resin, a cellulose resin, a rosin resin, a polyvinyl alcohol resin, a polyvinyl acetal resin, an ionomer resin or a petroleum resin; elastomers such as natural rubber, styrene-butadiene rubber, isoprene rubber, chloroprene rubber or a diene copolymer; rosin derivatives such as an ester rubber, a rosin-maleic acid resin, a rosin phenol resin or a hydrogenated rosin; a phenol resin, terpenes, a cyclopentadiene resin or aromatic hydrocarbon resins.

The thermal transfer layer having an intended softening or melting point can be obtained by suitably using the above described heat fusible compound or thermo plasticizer.

Various additives can be used in order to secure pigment dispersion property or to obtain excellent color reproduction.

The additives include a plasticizer for increasing sensitivity by plasticizing the colorant layer, a surfactant for improving coatability, and a matting agent having a submicron to millimicron order particle size for minimizing blocking.

The coating thickness of the colorant layer is preferably 0.2 to 2 μm, and more preferably 0.3 to 1.5 μm. The thickness of not more than 0.8 μm gives high sensitivity.

A method in which an image, formed by transferring from the recording medium on the image receiving layer of the image receiving sheet, is transferred on a final transferee can be mentioned for the mage forming by the laser thermal transfer recording according to the invention. Examples of the final transferee include a matte paper, high quality paper and light weight paper.

(Laser Thermal Transfer Recording Method)

The method for laser thermal transfer recording of the invention is characterized in that an image is formed by the image formed on the image receiving layer of the image receiving sheet is transferred onto the final image receiving element.

The exposure method using the heat-mode recording includes a method by which the exposure is performed through the support of the recording element contacting with a the image receiving sheet, and that by which the exposure is performed through the image receiving sheet.

When the exposure is performed from the support side of the recording element, it is advantageous for rising the transfer ability to add a colorant capable of absorbing heat ray into the image receiving layer and/or the thermally softenable layer so as to absorb light remained after absorption by the recording element for rising the efficiency of heat.

In the later case, the transparency of the image receiving sheet to the light from the light source is preferably not less than 70%, more preferably not less than 80%. Therefore, it is necessary to use a support and a thermally softening layer each having a high transparency, and to reduce the reflection at the surface of the backing layer and that at the interface between the support and the thermally softenable layer. It is preferable to use a thermally softenable layer having a refractive index smaller 0.1 or more than that of the support as the method for reducing the reflection at the interface between the support and the thermally softenable layer.

The typical process of the light-heat conversion type heat-mode recording method is described below.

FIG. 1 is an oblique view of the situation of the image receiving sheet winded on a dram-shaped sucking device in pile with the recording element. As a method for contacting the image receiving sheet 4 to the recording element on the sucking device, as shown in FIG. 1, the image receiving sheet and the recording element larger than the image receiving sheet in both of the lengthwise and widthwise directions are piled on the sucking device having small holes, sucking hole 2, so that the image receiving surface of the image receiving sheet is contacted to the ink layer of the recording element 3, and air is sucked through the small holes from the projected portion of the image receiving sheet around the recording element. Inversely, it is also possible to contact the image receiving sheet with the recording element by piling the image receiving sheet larger in both of the lengthwise and widthwise directions than the recording element so that the ink surface of the recording element is contacted to the image receiving surface of the image receiving sheet, and sucking air through the small holes (2-1 and 2-2 each show the opened and closed holes respectively) from the projected portion of the recording element around the image receiving sheet.

Both of transporting and winding of the recording element and the image receiving sheet can be easily automated, and the heat-mode recording can be carried out by exposing to light after the contacting.

Figure 2:
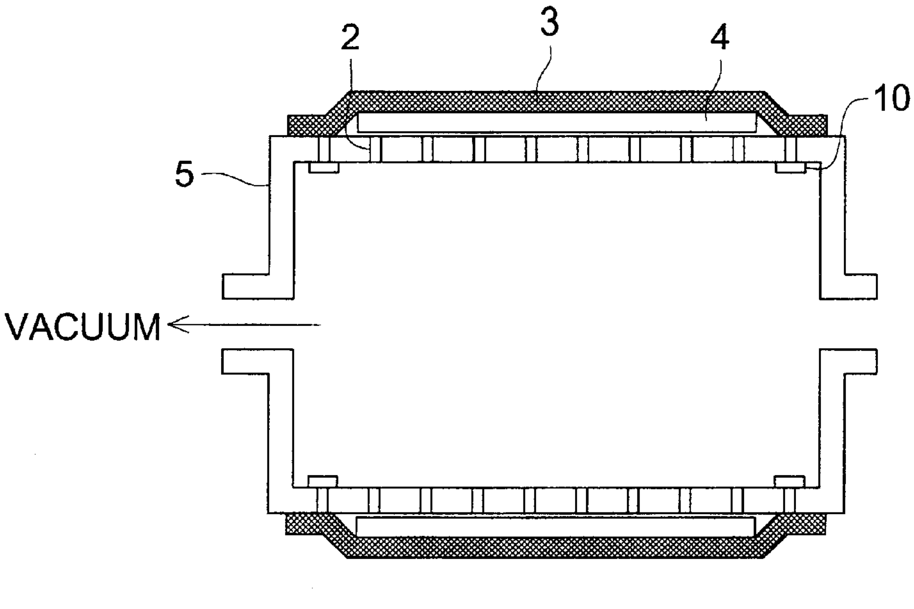
FIG. 2 shows a cross-section of principal constitution of the suction drum.
Figure 3:
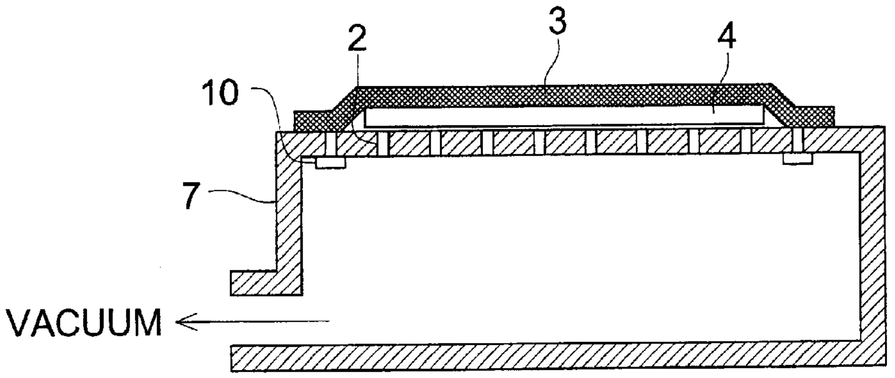
FIG. 3 shows a cross-section of the image receiving sheet contacted with a recording element on a suction plate.

The sucking device may be drum-shaped as shown in FIG. 2 or plate-shaped as. shown in FIG. 3. When a high speed recording is required, a cylindrical scanning using the drum-shaped sucking device is preferred compared to a plane scanning using a plate-shaped sucking device 7 and a polygon mirror or a galvano-mirror since the cylindrical scanning is smaller in loss in the optical system. FIG. 2 is a drawing showing a cross-section of principal constitution of the drum-shaped sucking device, and FIG. 3 is a drawing showing a cross-section of the image receiving sheet contacted with a recording element on a plate-shaped sucking device.

The thermal transfer recording is carried out by irradiating light according to the information to be recorded to the recording element and the image receiving sheet which are arranged by using such the sucking device so that the ink surface of the recording element and the image receiving surface of the image receiving sheet are completely contacted or extremely closed with together, herein after such the situation is referred to contacted state.

Figure 4:
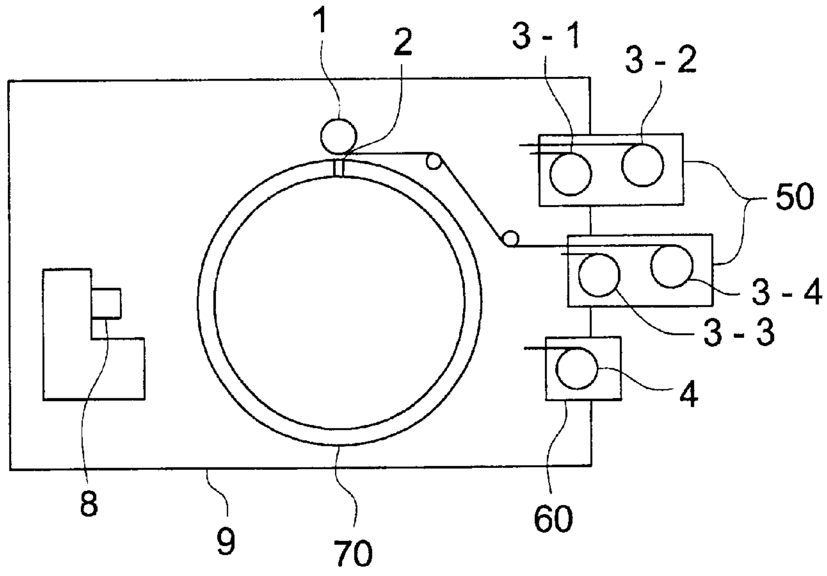
FIG. 4 shows the whole constitution around the suction drum and the suction device.

FIG. 4 shows the whole constitution around the suction drum and the sucking device. Although in FIG. 4, an example using a drum-shaped sucking device, the basic structure is the same when a plate-shaped sucking device is used.

In FIG. 4, numeral 1 is a pressure roller, 2 is a sucking hole, 3 is a recording element, 3-1, 3-2, 3-3 and 3-4 are each a yellow, magenta, cyan and black recording element, respectively, 50 is a recording element supplying means, 60 is an image receiving sheet supplying means, 70 is a holding means for sucking device, 8 is an optical writing means (a laser light source), and 9 is a case.

Figure 5:
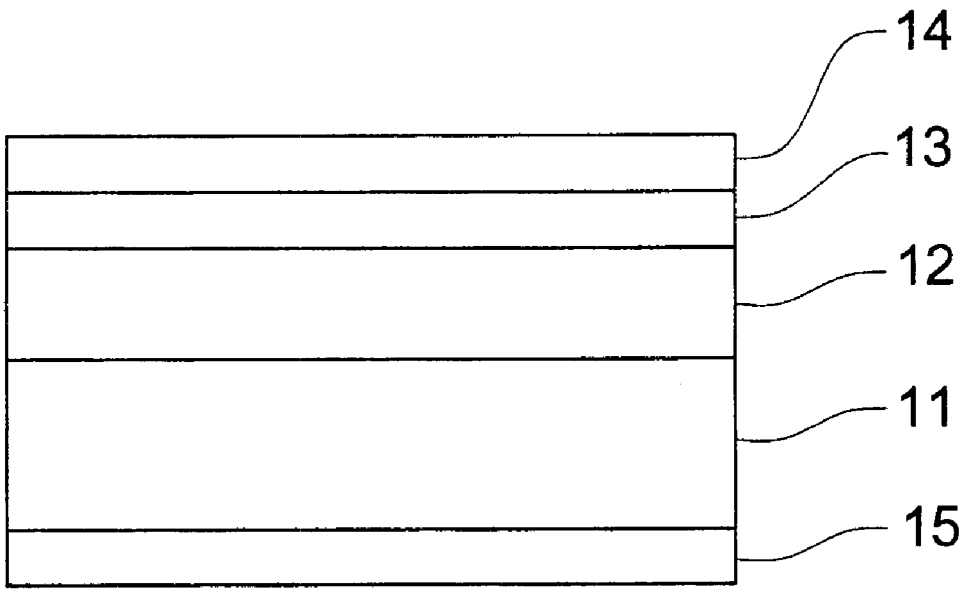
FIG. 5 shows a cross-section of the layer structure of the image receiving sheet.

When the image receiving sheet having the layer structure shown in FIG. 5 and the recording element are. winded on the sucking device, the image receiving sheet is firstly winded and fixed by sucking while closing the valve of sucking holes, then the recording element is wind while opening the sucking holes in sequence. By such the procedure, the time for winding can be shortened and a sufficient contact can be easily obtained. It is further effective to sequentially open the sucking valve while pressing by a squeezing roller.

In FIG. 5, 11 is a support, 12 is a thermally softenable layer, 13 is an interlayer, 14 is an image receiving layer and 15 is a backing layer of the image receiving sheet.

EXAMPLES

The invention is described in detail below according to the examples. The embodiment of the invention is not limited to the examples. In the examples, "part" is "part by weight" of the solid ingredient of the material.

Preparation of Recording Element

On a transparent PET, poly(ethylene terephthalate) T-100 manufactured by Mitsubishi Polyester Co., Ltd., a toluene solution of SEBS, G1657 manufactured by Shell Chemical Co., Ltd., was coated by a wire bar so that the dried layer thickness is 6 μm. On the coated layer, the following light-heat conversion layer coating liquid was coated by a wire bar so that the dried layer thickness was approximately 0.5 μm and the light absorbency at 830 nm was 1.0. Furthermore an ink layer coating liquid having the following composition was coated by a wire bar to prepare a recording element. Thickness of the ink layer was 0.5 μm.

| | |
|---|---|
| Light-heat conversion layer coating liquid | |
| Polyvinyl alcohol C-506 (KURARAY CO., LTD.) | 7.0 parts |
| Carbon black SD-9020 (DAINIPPONINK & CHEMICALS, INC.) | 3.0 parts |
| Water | 90.0 parts |
| Ink layer coating liquid | |
| Magenta pigment Brilliant Carmine 6B dispersed in methyl ethyl ketone (DAINICHISEIKA COLOR & CHEMICAL Mfg. Co., Ltd.) | 3.0 parts |
| Styrene-acryl resin Himer SBM43F (Sanyo Kasei Co., Ltd.) | 6.0 parts |
| Ethylene-vinyl acetate resin EV40Y (Mitsubishi du Pont Chemical Co., Ltd.) | 0.5 parts |
| Silicone resin particle, Tospal 120 (Toshiba Silicone Co., Ltd.) | 0.5 parts |
| Methyl ethyl ketone | 90.0 parts |

On a transparent PET having a thickness of 100 μm T-600E, manufactured by Mistubishi Polyester Co., Ltd., a thermally softenable layer coating liquid having the following composition was coated by an applicator so that the dried layer thickness was approximately 20 μm. On the coated layer an interlayer coating liquid having the following composition was coated so that the dried layer thickness was 4.0 μm, and an image receiving layer coating liquid having the following composition was further coated so that the dried layer thickness was approximately 1.5 μm.

| | |
|---|---|
| Thermally softenable layer coating liquid | |
| Polyethylene latex S3127, solid content: 35% (TOHO CHEMICAL INDUSTRY CO., LTD) | 100 parts |
| Interlayer coating liquid | |
| Ethyl cellulose N10G (Shin-Etsu Chemical Co., Ltd.) | 10.0 parts |
| Ethyl alcohol, Alcozole M9 (Kanto Kagaku Co., Ltd.) | 90.0 parts |
| Image receiving layer coating liquid | |
| Polyacrylate latex A-5801 (Nihon NSC Co., Ltd.) | 92.0 parts |
| Matting agent MX-300 | 8.0 parts |

The following image receiving sheets were prepared in the same manner as in the above-mentioned image receiving sheet except that the material in the thermally softenable layer or the image receiving layer was changed.

Preparation of Image Receiving Sheet 2

Image receiving sheet 2 was prepared in the same manner as in Image receiving sheet 1 except that the composition of the image receiving layer coating liquid was changed as follows and evaluated.

| Image receiving layer coating liquid | |
|---|---|
| Styrene-acryl copolymer latex GD46 (Nihon NSC Co., Ltd.) | 100 parts |

Preparation of Image Receiving Sheet 3

Image receiving sheet 3 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 75.0 parts |
| Wax emulsion A206, solid content: 40% (Gifu Shellac Co., Ltd.) | 25.0 parts |

Preparation of Image Receiving Sheet 4

Image receiving sheet 4 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 75.0 parts |
| Wax emulsion A212, solid content: 40% (Gifu Shellac Co., Ltd.) | 25.0 parts |

Preparation of Image Receiving Sheet 5

Image receiving sheet 5 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 75.0 parts |
| Low molecular weight polyolefin emulsion W950, solid content: 40% (Mitsui Kagaku CO., Ltd.) | 25.0 parts |

Preparation of Image Receiving Sheet 6

Image receiving sheet 6 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 97.5 parts |
| 2,2,4-trimatylpentanediol 1,3-monoisobutylate SC-12 (Nihon NSC Co., Ltd.) | 2.5 parts |

Preparation of Image Receiving Sheet 7

Image receiving sheet 7 was prepared in the same manner as in Image receiving sheet 1 except that the composition of the thermally softenable layer coating liquid was changed as follows and evaluated.
Thermally softenable layer coating liquid

| Thermally softenable layer coating liquid | |
|---|---|
| Polyacryl latex A5801 (Nihon NSC Co., Ltd.) | 85.0 parts |
| Wax emulsion A101, solid content: 40% (Gifu Shellac Co., Ltd.) | 15.0 parts |

Preparation of Image Receiving Sheet 8

Image receiving sheet 8 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 50.0 parts |
| Wax emulsion A101, solid content: 40% (Gifu Shellac Co., Ltd.) | 50.0 parts |

Preparation of Image receiving sheet 9

Image receiving sheet 9 was prepared in the same manner as in Image receiving sheet 1 except that the interlayer was omitted

Preparation of Image Receiving Sheet 10

Image receiving sheet 10 was prepared in the same manner as in Image receiving sheet 1 except that the composition of the thermally softenable layer coating liquid was changed as follows and evaluated.

| Thermally softenable layer coating liquid | |
|---|---|
| Polyacryl latex A5801 (Nihon NSC Co., Ltd.) | 100 parts |

Preparation of Image Receiving Sheet 11 for Comparative Example

Image receiving sheet 11 was prepared in the same manner as in Image receiving sheet 1 except that the composition of the thermally softenable layer coating liquid was changed as follows and evaluated.

| Thermally softenable layer coating liquid | |
|---|---|
| Ethylene-vinyl acetate resin EV45LX (Mitsui du Pont Polychemical Co., Ltd.) | 20.0 parts |
| Toluene | 80.0 parts |

Preparation of Image Receiving Sheet 12 for Comparative Example

Image receiving sheet 12 was prepared in the same manner as in Image receiving sheet 10 except that the composition of the thermally softening layer coating liquid was changed as follows and evaluated.

Details of thus obtained Image receiving sheets 1 through 12 are shown in Table 1.

roller of 130° C., that of lower roller of 100° C., at a speed of 18 mm/sec. and a pressure of 4 kg/cm. After the transfer, the image receiving sheet was peeled from the art paper and the peeling ability of the image receiving sheet was classified into the following three ranks according to the degree of remaining of the art paper by adhesion with the image receiving sheet.

A: The image receiving sheet was smoothly peeled without paper adhesion

B: The image receiving sheet was difficulty peeled and folding of the paper was caused even though the paper adhesion was not occurred.

C: Adhesion of the paper was occurred.

Sensitivity

The laser power at the surface to be exposed was varied and the power necessary to form a prescribed image density was required as the sensitivity. Lacking of the transferred image caused by a foreign matter

TABLE 1

| | Thermally softenable layer | | | | | | | | | Image receiving sheet property | | |
|---|---|---|---|---|---|---|---|---|---|---|---|---|
| | | | | | | | | Layer property | | | | |
| Image receiving sheet | Thermoplastic resin | TMA softening point | Melting point ° C. | Additive | Added amount wt % | Melting point ° C. | Needle penetration rate m/min. | Position change at 30° C. | Position change at 130° C. | Position change at 30° C. | Position change at 130° C. | Interlayer |
| 1 | S3127 | 82 | 100 | — | — | — | — | 0% | 100% | 0% | 85% | With |
| 2 | S3127 | 82 | 100 | — | — | — | — | 0% | 100% | 0% | 85% | With |
| 3 | A5801 | 62 | >150 | A206 | 25 | 100 | 201 | 0% | 65% | 0% | 50% | With |
| 4 | A5801 | 62 | >150 | A212 | 25 | 106 | 183 | 0% | 100% | 0% | 75% | With |
| 5 | A5801 | 62 | >150 | W950 | 25 | 100 | 151 | 0% | 65% | 0% | 46% | With |
| 6 | A5801 | 62 | >150 | CS12 | 2.5 | *1 | — | 0% | 80% | 0% | 55% | With |
| 7 | A5801 | 62 | >150 | A101 | 15 | 121 | 91 | 0% | 52% | 0% | 50% | With |
| 8 | A5801 | 62 | >150 | A101 | 50 | 121 | 91 | 0% | 82% | 0% | 60% | With |
| 9 | S3127 | 82 | 100 | — | — | — | — | 0% | 100% | 0% | 100% | Without |
| 10 | A5801 | 62 | >150 | — | — | — | — | 0% | 40% | 0% | 15% | With |
| 11 | EV45LX | 25 | 90 | — | — | — | — | 8% | 100% | 6% | 90% | With |
| 12 | A5801 | 62 | >150 | — | — | — | — | 0% | 40% | 0% | 40% | Without |

*1: Liquid at an ordinary temperature

Using the above-obtained Image receiving sheets 1 to 12 and the recording element, heat-mode transfer recording processes were performed according to the followings and the sensitivity, the fog, the lacking of transferred image caused by a foreign matter and the storage ability were evaluated according to the following procedures.

(Heat-mode Transfer)

The transfer was performed by exposing the recording element and the image receiving sheet which were contacted to the drum-shaped sucking device with a reduced pressure of 400 torr, to light beam of 830 nm having a $1/e^2$ spot diameter of 8 μm from a semiconductor laser at a line speed of 600 cm/second with a pitch of 6 μm The exposure power was changed from 30 to 100 mW.

(Evaluation)

Peeling ability between the image receiving layer and the interlayer

The recording element was uniformly exposed to sufficient amount of light so as to form an uniform solid image was formed on the image receiving sheet. Then thus formed image was faced to art paper, Tokuhishi Art manufactured by Mitsubishi Paper Mill Co., Ltd., having a size of 127 mm×187 mm and a weight of 110 kg/1,000 sheets, and the image was transferred by EV Laminater manufactured by Konica Corp. under the conditions of a temperature of upper A fiber (fiber dust) of 20 μm was inserted between the image receiving sheet and the recording element. Then exposure was given and the image was transferred. Lacking of the image around the fiber was observed and classified in the following four ranks.

AA: Image lacking around the fiber was not occurred.

A: Image lacking about 50 μm was occurred along the shape of the fiber.

B: Image density around the fiber was lowered.

C: A rounded shape having a diameter of about 2 mm of lacking of image was occurred around the fiber.

Storage Ability

The image receiving sheets were piled so that the image receiving surface was faced to the backing layer of another sheet and subjected to an accelerated storage test by heating at 55° C. for 7 days while applying a load of 50 g/cm$^2$. After the test, the blocking and the transfer ability (the fog and sensitivity) were evaluated. The transfer ability was evaluated by the foregoing procedure and the blocking was classified into the following four ranks.

AA: Blocking was not occurred even when a load of 100 g/cm$^2$ was applied.

A: Blocking was not occurred.

B: Peeling of the image receiving layer was partially occurred.

C: The sample was blocked completely. Secondary Transferring Ability

The recording element was uniformly exposed to sufficient amount of light so as to form an uniform solid image was formed on the image receiving sheet. Then thus formed image was faced to mat paper, New Age having a size of 127 mm×187 mm and a weight of 110 g/1,000 sheets, and the image was transferred by EV Laminater manufactured by Konica Corp. under the conditions of a temperature of upper roller of 130° C., that of lower roller of 100° C., at a speed of 18 mm/sec. and a pressure of 4 kg/cm. A adhesion tape, Nichiban Tape or Post It, was adhered onto the surface of the transferred image and peeled to evaluate the adhesion force of the image to the final transferring material. The results are classified into the following four ranks.

AA: The image was not peeled.

A: The image was partially peeled only by Nichiban Tape.

B: The image was wholly peeled only by Nichiban Tape.

C: The image was wholly peeled only by Post It.

Thus obtained result are shown in the following Table

TABLE 2

| Image receiving sheet | Peeling ability | Sensitivity | Storage ability | Secondary transferring ability | Transfer Lacking | Remarks |
|---|---|---|---|---|---|---|
| 1 | B | 70 | A | A | A | Inv. |
| 2 | B | 68 | A | B | C | Inv. |
| 3 | B | 66 | A | B | B | Inv. |
| 4 | B | 68 | A | A | B | Inv. |
| 5 | B | 68 | A | B | B | Inv. |
| 6 | B | 65 | B | A | A | Inv. |
| 7 | B | 70 | A | B | B | Inv. |
| 8 | B | 70 | A | B | B | Inv. |
| 9 | B | 66 | A | A | A | Inv. |
| 10 | B | 70 | C | D | C | Comp. |
| 11 | B | 70 | D | A | D | Comp. |
| 12 | D | *2 | D | D | D | Comp. |

*2: Not determinable

As is shown in Table 2, an image excellent in the sensitivity, storage ability and transfer ability can be formed by the image receiving sheet according to the invention. Moreover, the lacking of image caused by an adhered foreign matter can be prevented. In contrast, it is undertood that the comparative examples are not suitable for practical use since one or more of the foregoing points are not improved.

A large size output having a high precision and similar to a printed picture with no defect can be stably obtained by the use of the image receiving sheet according to the invention, and the quality of the printed picture can be reproduced with a high fidelity by transferring the image onto a paper to be practically used for the final printed matter.

Disclosed embodiment can be varied by a skilled person without departing from the spirit and scope of the invention.

What is claimed is:

1. An image receiving sheet for thermal transfer recording comprising a support, a lower layer and an image receiving layer, provided in this order from the support, wherein variation of position of point of a needle satisfies the following conditions when the needle having a diameter of 1 mm is touched on the image receiving sheet with a load of 10 g and the temperature is risen at a rate of 5° C. per minute;

$$\{(\text{Position at }25°\text{ C.}-\text{Position at }30°\text{ C.})/\text{Position at }25°\text{ C.}\}\times 100\% \leqq 5\%$$

$$\{(\text{Position at }25°\text{ C.}-\text{Position at }130°\text{ C.})/\text{Position at }25°\text{ C.}\}\times 100\% \geqq 50\%.$$

2. The image receiving sheet of claim 1 wherein variation of position of a point of a needle satisfies the following conditions when the needle having a diameter of 1 mm is touched on the image receiving sheet from which the image receiving layer is removed with a load of 10 g and the temperature is risen at a rate of 5° C. per minute;

$$\{(\text{Position at }25°\text{ C.}-\text{Position at }30°\text{ C.})/\text{Position at }25°\text{ C.}\}\times 100\% \leqq 5\%$$

$$\{(\text{Position at }25°\text{ C.}-\text{Position at }130°\text{ C.})/\text{Position at }25°\text{ C.}\}\times 100\% \geqq 50\%.$$

3. The image receiving sheet of claim 1 wherein variation of position of a point of a needle satisfies the following conditions when the needle having a diameter of 1 mm is touched on the surface of lower layer of the image receiving sheet with a load of 10 g and the temperature is risen at a rate of 5° C. per minute;

$$\{(\text{Position at }25°\text{ C.}-\text{Position at }30°\text{ C.})/\text{Position at }25°\text{ C.}\}\times 100\% \leqq 5\%$$

$$\{(\text{Position at }25°\text{ C.}-\text{Position at }130°\text{ C.})/\text{Position at }25°\text{ C.}\}\times 100\% \geqq 50\%.$$

4. The image receiving sheet of claim 1 wherein the lower layer contains a thermoplastic resin having a TMA softening point of less than 100° C. and a compound having a melting point of less than 150° C.

5. The image receiving sheet of claim 4 wherein difference between melting point of the thermoplastic resin and TMA softening point of the thermoplastic resin is not less than 50° C.

6. The image receiving sheet of claim 4 wherein content of the thermoplastic resin is not less than 50 weight % with respect to the weight of the lower layer and content of the compound having a melting point of less than 150° C. is 10 to 50 weight % with respect to the weight of the lower layer.

7. The image receiving sheet of claim 4 wherein penetration rate of the needle into the compound having a melting point of less than 150° C. at the melting point of the compound is not less than 50 $\mu$m/min.

8. The image receiving sheet of claim 1 wherein the lower layer contains a thermoplastic resin having a TMA softening point of 30 to 100° C. and having a melting point of 80 to 150° C. and difference between melting point and TMA softening point of the thermoplastic resin is less than 50° C.

9. The image receiving sheet of claim 8 wherein content of the thermoplastic resin is not less than 50 weight % with respect to the weight of the lower layer.

10. The image receiving sheet of claim 1 wherein the image receiving layer contains a thermoplastic resin and a matting agent.

11. The image receiving sheet of claim 1 wherein an interlayer is provided between the lower layer and the image receiving layer and the adhesion force between the lower layer and the inter layer is larger than the adhesion force between the interlayer and the image receiving layer.

12. The image receiving sheet of claim 11 wherein the interlayer has a thickness of from 0.2 to 15 $\mu$m and a glass transition point Tg of not less than 80° C. or a tensile strength of not less than 3.5 kg/cm$^2$.

13. The image receiving sheet of claim 1 wherein thermal transfer is induced by laser light irradiation.

14. A thermal transfer recording method comprising steps of;

contacting an image receiving sheet to an ink sheet, imagewise-heating of the contacted image receiving sheet and the ink sheet, whereby ink of the ink sheet is transferred imagewise to the image receiving sheet, separating the ink sheet from image receiving sheet, contacting the image receiving sheet having transferred ink image to a final transferee, and transferring the image formed on the image receiving sheet to the final transferee, wherein the image receiving sheet for thermal transfer recording comprising a support, a lower layer and an image receiving layer, provided in this order from the support, wherein variation of position of point of a needle satisfies the following conditions when the needle having a diameter of 1 mm is touched on the image receiving sheet with a load of 10 g and the temperature is risen at a rate of 50° C. per minute;

$$\{(\text{Position at } 25^\circ\text{ C.} - \text{Position at } 30^\circ\text{ C.})/\text{Position at } 25^\circ\text{ C.}\}\times 100\% \leqq 5\%$$

$$\{(\text{Position at } 25^\circ\text{ C.} - \text{Position at } 130^\circ\text{ C.})/\text{Position at } 25^\circ\text{ C.}\}\times 100\% \geqq 50\%.$$

15. The thermal transfer recording method of claim 14 wherein imagewise-heating of the contacted image receiving sheet and the ink sheet is induced by laser light exposure.

16. The thermal transfer recording method of claim 14 wherein the image is transferred to the final transferee by transferring the image receiving layer of the image receiving sheet for thermal transfer recording.

* * * * *